(12) United States Patent
Nonaka et al.

(10) Patent No.: US 8,155,928 B2
(45) Date of Patent: Apr. 10, 2012

(54) METHOD FOR GENERATING DATA OF PLANT CONSTRUCTION SIMULATION AND SYSTEM THEREOF

(75) Inventors: Hisanori Nonaka, Tokai (JP); Kenji Araki, Mito (JP); Norito Watanabe, Hitachi (JP); Yoshibumi Fukuda, Kasama (JP); Toshiyuki Miyake, Hitachi (JP); Masatoshi Takada, Hitachi (JP); Hisako Okada, Mito (JP)

(73) Assignee: Hitachi-GE Nuclear Energy, Ltd., Ibaraki (JP)

( * ) Notice: Subject to any disclaimer, the term of this patent is extended or adjusted under 35 U.S.C. 154(b) by 592 days.

(21) Appl. No.: 12/354,236

(22) Filed: Jan. 15, 2009

(65) Prior Publication Data

US 2009/0187384 A1    Jul. 23, 2009

(30) Foreign Application Priority Data

Jan. 18, 2008  (JP) .................... 2008-008623

(51) Int. Cl.
*G06F 17/50* (2006.01)
(52) U.S. Cl. ......................................... 703/1
(58) Field of Classification Search .............. 703/1
See application file for complete search history.

(56) References Cited

U.S. PATENT DOCUMENTS 7,042,468 B2 *   5/2006  Schwegler et al. ............ 345/629
7,752,065 B2 *   7/2010  Buzz ................................ 703/1

FOREIGN PATENT DOCUMENTS

| JP | 07-247688 | 9/1995 |
|----|-----------|--------|
| JP | 09-268760 | 10/1997 |
| JP | 2001-249985 | 9/2001 |
| JP | 2002-123786 | 4/2002 |
| JP | 2005-018673 | 1/2005 |
| JP | 2005-038028 | 2/2005 |
| JP | 2005-050098 | 2/2005 |

OTHER PUBLICATIONS

McKinney et al., Automation in Construction 7., 1998., "Generating, evaluating and visualizing construction schedules with CAD tools"., p. 433-447.*

* cited by examiner

*Primary Examiner* — Paul Rodriguez
*Assistant Examiner* — Eunhee Kim
(74) *Attorney, Agent, or Firm* — Antonelli, Terry, Stout & Kraus, LLP.

(57) ABSTRACT

A scheduling system and a CAD system are used to prepare a construction plan in plant construction simulation. A construction work managed by the scheduling system and a plant part used in the construction work and managed by the CAD system, are managed in association with each other. When the plant part is broken down into a plurality of lower plant parts constituting the plant part, as a plurality of lower construction works of the construction work, the processing for associating the lower plant parts with the lower construction works is performed. Data for mutually associating the construction works and the plant parts based on the processing is generated. The generated data is used to mutually link the scheduling system and the CAD system, and a situation in which appropriate parts are installed as progress of the construction work, is displayed.

12 Claims, 22 Drawing Sheets

FIG. 5A

WORK DATA

| CONSTRUCTION WORK ID | WORK NAME | UPPER CONSTRUCTION WORK ID | ASSOCIATED PART ID | OTHER WORK ATTRIBUTES | | | |
|---|---|---|---|---|---|---|---|
| | | | | DATE TO START WORK | DATE TO FINISH WORK | NUMBER OF MAN-HOURS FOR WORK | ... |
| W1 | INSTALLATION OF LARGE-BORE PIPE | — | P1 | 2008/01/01 | 2008/01/30 | 30 | ... |

FIG. 5B

PART DATA

| PLANT PART ID | PART NAME | UPPER PLANT PART ID | ASSOCIATED WORK ID | OTHER PART ATTRIBUTES | | | |
|---|---|---|---|---|---|---|---|
| | | | | DIAMETER | THICKNESS | INSTALLATION POSITION 1 | ... |
| P1 | LARGE-BORE PIPE | — | W1 | 120 | 20 | (10, 20, 30) | ... |

FIG. 6A

WORK DATA

| CONSTRUCTION WORK ID | WORK NAME | UPPER CONSTRUCTION WORK ID | ASSOCIATED PART ID | OTHER WORK ATTRIBUTES | | | |
|---|---|---|---|---|---|---|---|
| | | | | NUMBER OF MAN-HOURS FOR WORK | DATE TO START WORK | DATE TO FINISH WORK | |
| W1 | INSTALLATION OF LARGE-BORE PIPE | — | P1 | 30 | 2008/01/01 | 2008/01/30 | ... |
| W1-1 | CARRYING-IN OF LARGE-BORE PIPE | W1 | P1 | 10 | 2008/01/01 | 2008/01/10 | ... |
| W1-2 | WELDING OF LARGE-BORE PIPE | W1 | P1 | 10 | 2008/01/11 | 2008/01/20 | ... |
| W1-3 | INSPECTION OF LARGE-BORE PIPE | W1 | P1 | 10 | 2008/01/21 | 2008/01/30 | ... |

FIG. 6B

PART DATA

| PLANT PART ID | PART NAME | UPPER PLANT PART ID | ASSOCIATED WORK ID | OTHER PART ATTRIBUTES | | | |
|---|---|---|---|---|---|---|---|
| | | | | DIAMETER | THICKNESS | INSTALLATION POSITION 1 | |
| P1 | LARGE-BORE PIPE | — | W1 | 120 | 20 | (10, 20, 30) | ... |

FIG. 8A

WORK DATA

| CONSTRUCTION WORK ID | WORK NAME | UPPER CONSTRUCTION WORK ID | ASSOCIATED PART ID | OTHER WORK ATTRIBUTES | | |
|---|---|---|---|---|---|---|
| | | | | DATE TO START WORK | DATE TO FINISH WORK | NUMBER OF MAN-HOURS FOR WORK |
| W1 | INSTALLATION OF LARGE-BORE PIPE | — | P1 | 2008/01/01 | 2008/01/30 | 30 |
| ⋮ | ⋮ | ⋮ | ⋮ | ⋮ | ⋮ | ⋮ |

FIG. 8B

PART DATA

| PLANT PART ID | PART NAME | UPPER PLANT PART ID | ASSOCIATED WORK ID | OTHER PART ATTRIBUTES | | |
|---|---|---|---|---|---|---|
| | | | | DIAMETER | THICKNESS | INSTALLATION POSITION 1 |
| P1 | LARGE-BORE PIPE | — | W1 | 120 | 20 | (10, 20, 30) |
| P1-1 | LARGE-BORE PIPE LINE 1 | P1 | | 120 | 20 | (10, 20, 30) |
| P1-2 | LARGE-BORE PIPE LINE 2 | P1 | | 120 | 20 | (10, 20, 50) |
| ⋮ | ⋮ | ⋮ | ⋮ | ⋮ | ⋮ | ⋮ |

FIG. 9A

WORK DATA

| CONSTRUCTION WORK ID | WORK NAME | UPPER CONSTRUCTION WORK ID | ASSOCIATED PART ID | OTHER WORK ATTRIBUTES | | | |
|---|---|---|---|---|---|---|---|
| | | | | DATE TO START WORK | DATE TO FINISH WORK | NUMBER OF MAN-HOURS FOR WORK | |
| W1 | INSTALLATION OF LARGE-BORE PIPE | — | P1 | 2008/01/01 | 2008/01/31 | 30 | ... |
| W1-1 | INSTALLATION OF LARGE-BORE PIPE LINE 1 | W1 | P1-1 | 2008/01/01 | 2008/01/31 | 15 | ... |
| W1-2 | INSTALLATION OF LARGE-BORE PIPE LINE 2 | W1 | P1-2 | 2008/01/01 | 2008/01/31 | 15 | ... |

FIG. 9B

PART DATA

| PLANT PART ID | PART NAME | UPPER PLANT PART ID | ASSOCIATED WORK ID | OTHER PART ATTRIBUTES | | | |
|---|---|---|---|---|---|---|---|
| | | | | DIAMETER | THICKNESS | INSTALLATION POSITION 1 | |
| P1 | LARGE-BORE PIPE | — | W1 | 120 | 20 | (10, 20, 30) | ... |
| P1-1 | LARGE-BORE PIPE LINE 1 | P1 | W1-1 | 120 | 20 | (10, 20, 30) | ... |
| P1-2 | LARGE-BORE PIPE LINE 2 | P1 | W1-2 | 120 | 20 | (10, 20, 50) | ... |

FIG. 15

BREAKDOWN MANAGEMENT DATA

| CONSTRUCTION WORK ID | WORK NAME | UPPER CONSTRUCTION WORK ID | ASSOCIATED PART ID | PART NAME | UPPER PLANT PART ID | PROGRESS OF WORK BREAKDOWN AND PART BREAKDOWN |
|---|---|---|---|---|---|---|
| W1 | INSTALLATION OF LARGE-BORE PIPE | — | P1 | LARGE-BORE PIPE | — | — |
| W1-1 | INSTALLATION OF LARGE-BORE PIPE LINE 1 | W1 | P1-1 | LARGE-BORE PIPE LINE 1 | P1 | PART BREAKDOWN: P1(LARGE-BORE PIPE) IS BROKEN INTO LINE 1 AND LINE 2 |
| W1-2 | INSTALLATION OF LARGE-BORE PIPE LINE 2 | W1 | P1-2 | LARGE-BORE PIPE LINE 2 | P1 | |
| W1-1-1 | CARRYING-IN OF LARGE-BORE PIPE LINE 1 | W1-1 | P1-1 | LARGE-BORE PIPE LINE 1 | P1 | WORK BREAKDOWN: W1(INSTALLATION OF LARGE-BORE PIPE) IS BROKEN INTO CARRYING-IN, WELDING, AND INSPECTION |
| W1-1-2 | WELDING OF LARGE-BORE PIPE LINE 1 | W1-1 | P1-1 | LARGE-BORE PIPE LINE 1 | P1 | |
| W1-1-3 | INSPECTION OF LARGE-BORE PIPE LINE 1 | W1-1 | P1-1 | LARGE-BORE PIPE LINE 1 | P1 | |
| W1-2-1 | CARRYING-IN OF LARGE-BORE PIPE LINE 2 | W1-2 | P1-2 | LARGE-BORE PIPE LINE 2 | P1 | |
| W1-2-2 | WELDING OF LARGE-BORE PIPE LINE 2 | W1-2 | P1-2 | LARGE-BORE PIPE LINE 2 | P1 | |
| W1-2-3 | INSPECTION OF LARGE-BORE PIPE LINE 2 | W1-2 | P1-2 | LARGE-BORE PIPE LINE 2 | P1 | |

FIG. 17

WORK DATA

| CONSTRUCTION WORK ID | WORK NAME | UPPER CONSTRUCTION WORK ID | ASSOCIATED PART ID | OTHER WORK ATTRIBUTES | | | |
|---|---|---|---|---|---|---|---|
| | | | | DATE TO START WORK | DATE TO FINISH WORK | NUMBER OF MAN-HOURS FOR WORK | |
| W1 | INSTALLATION OF LARGE-BORE PIPE | — | P1 | 2008/01/01 | 2008/01/31 | 30 | ... |
| W1-1 | INSTALLATION OF LARGE-BORE PIPE LINE 1 | W1 | P1-1 | 2008/01/01 | 2008/01/31 | 15 | ... |
| W1-2 | INSTALLATION OF LARGE-BORE PIPE LINE 2 | W1 | P1-2 | 2008/01/01 | 2008/01/31 | 15 | ... |
| W1-1-1 | CARRYING-IN OF LARGE-BORE PIPE LINE 1 | W1-1 | P1-1 | 2008/01/01 | 2008/01/31 | 5 | ... |
| W1-1-2 | WELDING OF LARGE-BORE PIPE LINE 1 | W1-1 | P1-1 | 2008/01/01 | 2008/01/31 | 5 | ... |
| W1-1-3 | INSPECTION OF LARGE-BORE PIPE LINE 1 | W1-1 | P1-1 | 2008/01/01 | 2008/01/31 | 5 | ... |
| W1-2-1 | CARRYING-IN OF LARGE-BORE PIPE LINE 2 | W1-2 | P1-2 | 2008/01/01 | 2008/01/31 | 5 | ... |
| W1-2-2 | WELDING OF LARGE-BORE PIPE LINE 2 | W1-2 | P1-2 | 2008/01/01 | 2008/01/31 | 5 | ... |
| W1-2-3 | INSPECTION OF LARGE-BORE PIPE LINE 2 | W1-2 | P1-2 | 2008/01/01 | 2008/01/31 | 5 | ... |

FIG. 19

WORK BREAKDOWN RULE DATA

| RULE NO. | CONSTRUCTION WORK | LOWER CONSTRUCTION WORK | EXECUTION ORDER |
|---|---|---|---|
| 1 | INSTALLATION OF LARGE-BORE PIPE | CARRYING-IN OF LARGE-BORE PIPE | 1 |
| | | WELDING OF LARGE-BORE PIPE | 2 |
| | | INSPECTION OF LARGE-BORE PIPE | 3 |
| 2 | CARRYING-IN OF LARGE-BORE PIPE | CARRYING-IN OF LARGE-BORE PIPE CRANE | 1 |
| | | TEMPORARY PLACEMENT OF LARGE-BORE PIPE | 2 |
| 3 | INSTALLATION OF ELECTRIC EQUIPMENT | INSTALLATION OF ELECTRIC EQUIPMENT BASE | 1 |
| | | CARRYING-IN OF ELECTRIC EQUIPMENT | 2 |
| | | WIRING OF ELECTRIC EQUIPMENT | 3 |
| | | INSPECTION OF ELECTRIC EQUIPMENT | 4 |
| ⋮ | ⋮ | ⋮ | ⋮ |

FIG. 20

PART BREAKDOWN RULE DATA

| RULE NO. | PLANT PART | LOWER PLANT PART | EXECUTION ORDER |
|---|---|---|---|
| 1 | LARGE-BORE PIPE | LINE 1 | 1 |
| | | LINE 2 | 2 |
| 2 | LINE 1 | STRAIGHT PIPE 1 | 3 |
| | | CURVED PIPE 1 | 1 |
| | | STRAIGHT PIPE 2 | 2 |
| 3 | ELECTRIC EQUIPMENT | UPPER STRUCTURAL BODY | 1 |
| | | MAIN BODY OF ELECTRIC EQUIPMENT | 2 |
| | | CONTROL BOX | 3 |
| | | LOWER STRUCTURAL BODY | 4 |
| : | : | : | : |

METHOD FOR GENERATING DATA OF PLANT CONSTRUCTION SIMULATION AND SYSTEM THEREOF

CLAIM OF PRIORITY

The present application claims priority from Japanese Patent application serial no. 2008-008623, filed on Jan. 18, 2008, the content of which is hereby incorporated by reference into this application.

BACKGROUND OF THE INVENTION

The present invention relates to a method for generating data of plant construction simulation and a system thereof and, more particularly, to a method for generating data of plant construction simulation and a system thereof, in which creation and verification of a construction plan are supported by using a three-dimensional computer-aided design (CAD) system, favorable to apply to a plan of construction works of a power plant, a chemical plant and the like.

Three-dimensional CAD (3D-CAD) systems have been utilized in the design of power plants, chemical plants, and the like in recent years. By using a 3D-CAD system, the layout and shapes of a plant building, equipments, and pipes can be displayed on display and the presence or absence of interference among the equipments and pipes, their shapes and sizes, and workability of the construction can be checked before actual construction of the plant starts. The use of the 3D-CAD system also makes it possible to determine specific sizes of the equipments and pipes and their part numbers based on design data prepared by the 3D-CAD system, issue a manufacturing order to pipe and equipment vendors, and print out images displayed on the display of the 3D-CAD system to instruct construction works.

As the performance of computers has been improved, the 3D-CAD systems can be used not only to design plants but also to create construction plans. Specifically, the 3°D.-CAD system can be used to simulate plant construction in virtual reality, verify whether carrying-in sequences of equipments, pipes, and the like and construction procedures are valid, and finally create a construction plan that can be efficiently executed. The CAD systems used as described above are often referred to as four-dimensional CAD (4D-CAD) systems because one dimension, which is a time axis, is added to the 3D-CAD systems.

Specifically, an installation planning system is proposed in Japanese Patent Laid-open No. 2001-249985 as a conventional technology concerning the above-mentioned 4D-CAD system.

In the method and system proposed in Japanese Patent Laid-open No. 2001-249985, a method and a system in which a three-dimensional model for construction members is created, a installation plan for construction is created by a process planning system, and an installation simulation in which the three-dimensional model and installation plan are mutually associated is carried out before the installation plan is executed, are proposed.

SUMMARY OF THE INVENTION

To perform a construction simulation based on 4D-CAD, it is necessary to associate the construction works (process activities) such as carrying-in, welding, and inspection with plant parts (CAD objects) such as equipments and pipes being objects of these construction works. In conventional practice, management of the construction works and management of plant parts have been independently carried out by the process planning system and 3D-CAD system, so it has been difficult to execute a simulation in which the process planning system and 3D-CAD system are organically linked.

In the above conventional example, a simulation in which the construction works managed by the process planning system and plant parts managed by the 3D-CAD system are mutually associated is proposed. Although the association between the construction works and plant parts has been computer-aided by the 3D-CAD system, most of the association has been manually carried out. Specifically, a desired work operation had to be selected from a process planning table displayed on the computer screen, and plant parts selected by using the 3D-CAD system had to be associated with one of the selected construction works at a time. In practice, one plant includes thousands to tens of thousands of parts and the construction works, and thereby a tremendous amount of work for the association has been problematic.

An object of the present invention is to provide a method for generating data of plant construction simulation and a system thereof that can achieve efficient association between plant parts and construction works concurrently with the breakdown of upper construction work (or upper plant parts) into lower construction work (or lower plant parts) during execution of a construction plan.

When viewed from another angle, an object of the present invention is to provide a method for generating data of plant construction simulation and a system thereof that can achieve efficient association between construction works and plant parts while a construction planner executes a construction plan (breaks down construction works) and a plant design (breaks down plant parts).

A feature of the present invention for attaining the above object is a method for generating data of plant construction simulation, in which a scheduling system and a CAD system are used to prepare a construction plan, comprises a step for managing a construction work managed by the scheduling system and a plant part used in the construction work and managed by the CAD system in association with each other, and a step for performing processing for associating the plant part with each of a plurality of lower construction work constituting the construction work, which are produced when the construction works are broken down.

Furthermore, a another feature of the present invention for attaining the above object is a method for generating data of plant construction simulation, in which a scheduling system and a CAD system are used to prepare a construction plan, comprises a step for managing a construction work managed by the scheduling system and a plant part used in the construction work and managed by the CAD system in association with each other and a step for generating, when the plant part is broken down into a plurality of lower plant parts constituting the plant part, as a plurality of lower construction works of the construction work as the number of lower plant parts and performing processing for associating the lower plant parts with the lower construction works.

In the method for generating data of plant construction simulation according to the present invention, it is preferable that data for mutually associating the construction works and the plant parts based on the above processing is generated, and the generated data is used to mutually link the scheduling system and the CAD system and a situation in which appropriate parts are installed as the progress of the construction work is displayed.

In the method for generating data of plant construction simulation according to the present invention, it is preferable that number of man-hours required to execute the generated lower construction works as well as required equipment and materials are estimated based on the types of the generated lower construction works and the types and geometries of plant parts associated with these lower construction works.

A feature of the present invention for attaining the above object is a system for generating data of plant construction simulation, in which a scheduling system and a CAD system are used to generate information of construction plan, comprises an apparatus for specifying an arbitrary construction work managed by the scheduling system, an input apparatus for entering a dividing number by which the specified construction work is broken down, an apparatus for generating lower construction works by the number equal to the entered dividing number, an apparatus for identifying a plant part associated with the specified construction work, and an apparatus for associating the identified plant part with each the generated lower plant part.

Furthermore, a another feature of the present invention for attaining the above object is a system for generating data of plant construction simulation, in which a scheduling system and a CAD system are used to generate information of a construction plan, comprises an apparatus for specifying an arbitrary plant part managed by the CAD system, an apparatus for identifying a construction work associated with the specified plant part, an input apparatus for entering a dividing number by which the specified plant part is broken down, an apparatus for generating lower plant parts of the specified plant part and lower construction works of the construction work by the number equal to the entered dividing number, and an apparatus for associating the lower plant parts with the lower construction works.

In a system for generating data of plant construction simulation according to the present invention, it is a preferable that the system has data for mutually associating the construction works and the plant parts based on the above processing is generated, and the generated data is used to mutually link the scheduling system and the CAD system and a situation in which appropriate parts are installed as the progress of the construction work is displayed.

In the system for generating data of plant construction simulation according to the present invention, it is preferable that number of man-hours required to execute the generated lower construction works as well as required equipment and materials are estimated based on the types of the generated lower construction works and the types and geometries of plant parts associated with these lower construction works.

An outline of a system for generating data of plant construction simulation according to the present invention to solve the conventional problem will be described with reference to FIGS. 1 and 2.

FIG. 1 shows an entire structure of the system for generating data of plant construction simulation according to the present invention. This system comprises a 3D-CAD system, a database managed by the 3D-CAD system, a process planning system, a database managed by the process planning system, a breakdown and association management system for managing association between construction works and plant parts, a database managed by this system, and user interface used by one or more construction planners to operate these systems.

The breakdown and association management system supports association between construction works and plant parts concurrently with the breakdown of an individual construction work or plant part during construction work planning or plant part planning.

FIG. 2 shows the internal structure of the breakdown and association management system. The construction planner operates the process planning system and 3D-CAD system through the user interface and breakdown and association processing system and inputs a desired construction work or plant part to a breakdown method input system to indicate which of a construction work and plant part is to be broken down. Upon reception of the input, the breakdown and association processing system executes breakdown processing of the construction work or plant part. Association between construction works and plant parts is automatically carried out concurrently with the breakdown processing, updating construction work data (process planning data) or plant part data (3D-CAD data). The progress of the breakdown is stored in the breakdown management database by being associated with the breakdown object and a breakdown result. The process planning system or 3D-CAD system is notified through the interface system that data has been updated, and each the image information being displayed are updated, enabling the construction planner to check the result of the breakdown and association of the construction work or plant part.

According to the present invention, when upper construction work (or upper plant part) is broke down into lower construction works (or lower plant parts) during execution of a construction plan, the association between the plant parts and construction works is automatically executed at the same time.

When viewed from another angle, according to the present invention, in a process for executing a construction plan (breaks down construction work) and a plant design (breaks down plant parts), the construction works and plant parts are mutually associated automatically at the same time.

Accordingly, data used to mutually associate construction works and plant parts, which are required in a 4D-CAD simulation, can be efficiently generated, enabling validity of a construction plant to be verified though a large-scale 4D-CAD simulation, which was not previously feasible.

BRIEF DESCRIPTION OF THE DRAWINGS

FIG. 5A is an explanatory drawing showing sample work data being used the breakdown of the construction work.

FIG. 5B is an explanatory drawing showing sample part data being used the breakdown of the construction work.

FIG. 6A is an explanatory drawing showing sample work data after the breakdown of the construction work has been carried out.

FIG. 6B is an explanatory drawing showing sample part data after the breakdown of the construction work has been carried out.

FIG. 8A is an explanatory drawing showing sample work data being used the breakdown of the plant part.

FIG. 8B is an explanatory drawing showing sample part data being used the breakdown of the plant part.

FIG. 9A is an explanatory drawing showing sample work data after the breakdown of the plant part has been carried out.

FIG. 9B is an explanatory drawing showing sample part data after the breakdown of the plant part has been carried out.

FIG. 15 is an explanatory drawing showing a breakdown management data obtained as a result of the breakdown of the construction work and the breakdown of the plant part.

FIG. 17 is an explanatory drawing showing an example of construction work data.

FIG. 19 is an explanatory drawing showing an example of the breakdown rules of the construction work.

FIG. 20 is an explanatory drawing showing an example of the breakdown rules of the plant part.

DETAILED DESCRIPTION OF THE PREFERRED EMBODIMENTS

An embodiment of the present invention will be described below by using specific examples.

Figure 16:
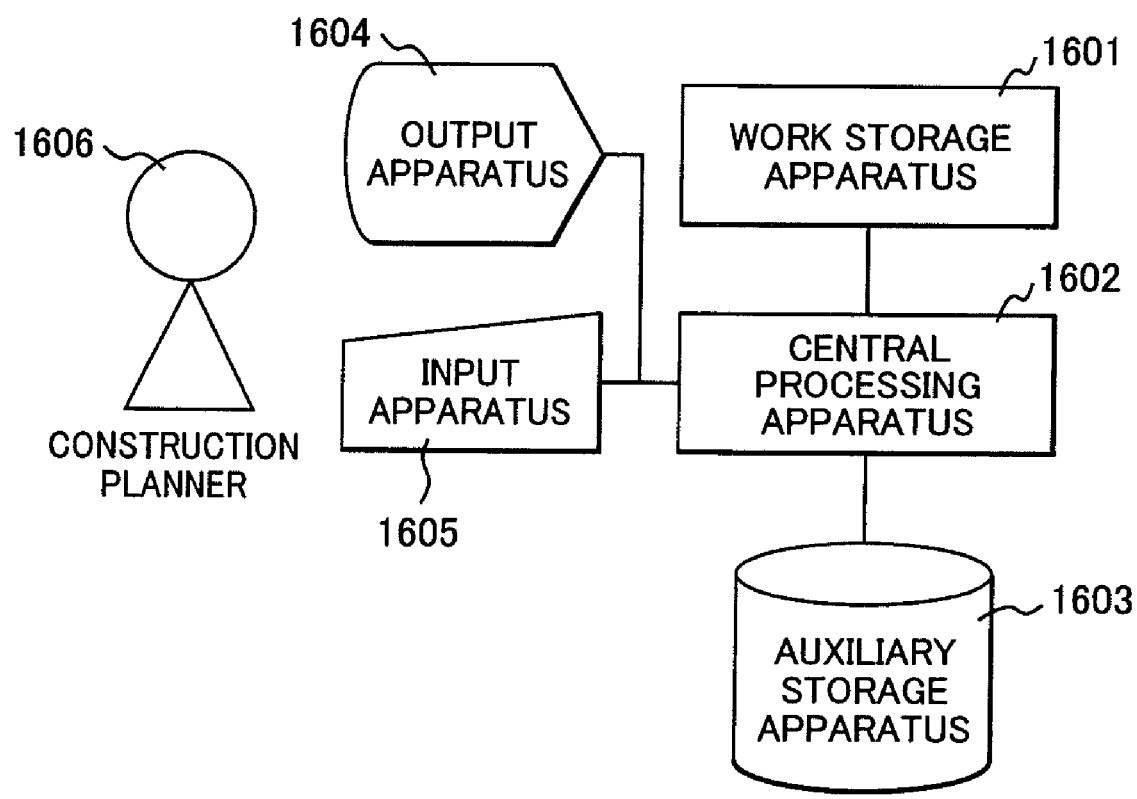
FIG. 16 is a structural diagram showing hardware of a system for generating data of plant construction simulation according to embodiment of the present invention.

FIG. 16 shows an example of a structure of hardware of a system for generating data of plant construction simulation according to embodiment of the present invention. The system is comprised of a work storage apparatus 1601, a central processing apparatus 1602, an auxiliary storage apparatus 1603, an ordinary output apparatus 1604 typified by a CRT or printer, and an ordinary input apparatus 1605 typified by a keyboard, mouse, camera, and microphone. A processing program for managing data of plant construction simulation in this embodiment, its related 3D-CAD program and process plan program are prestored in the auxiliary storage unit 1603, read out by the central processing apparatus 1602 into the work storage apparatus 1601, and interpreted and executed one step at a time by the central processing apparatus 1602.

Figure 1:
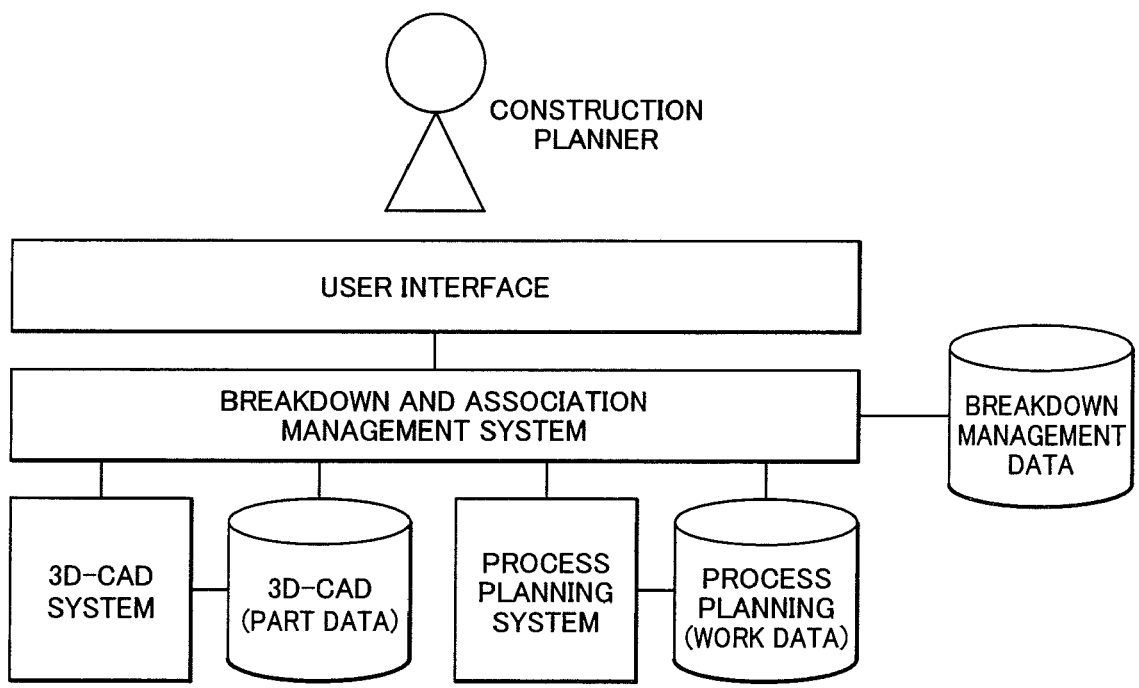
FIG. 1 is a structural diagram showing a system for generating data of plant construction simulation according to a preferred embodiment of the present invention.
Figure 3:
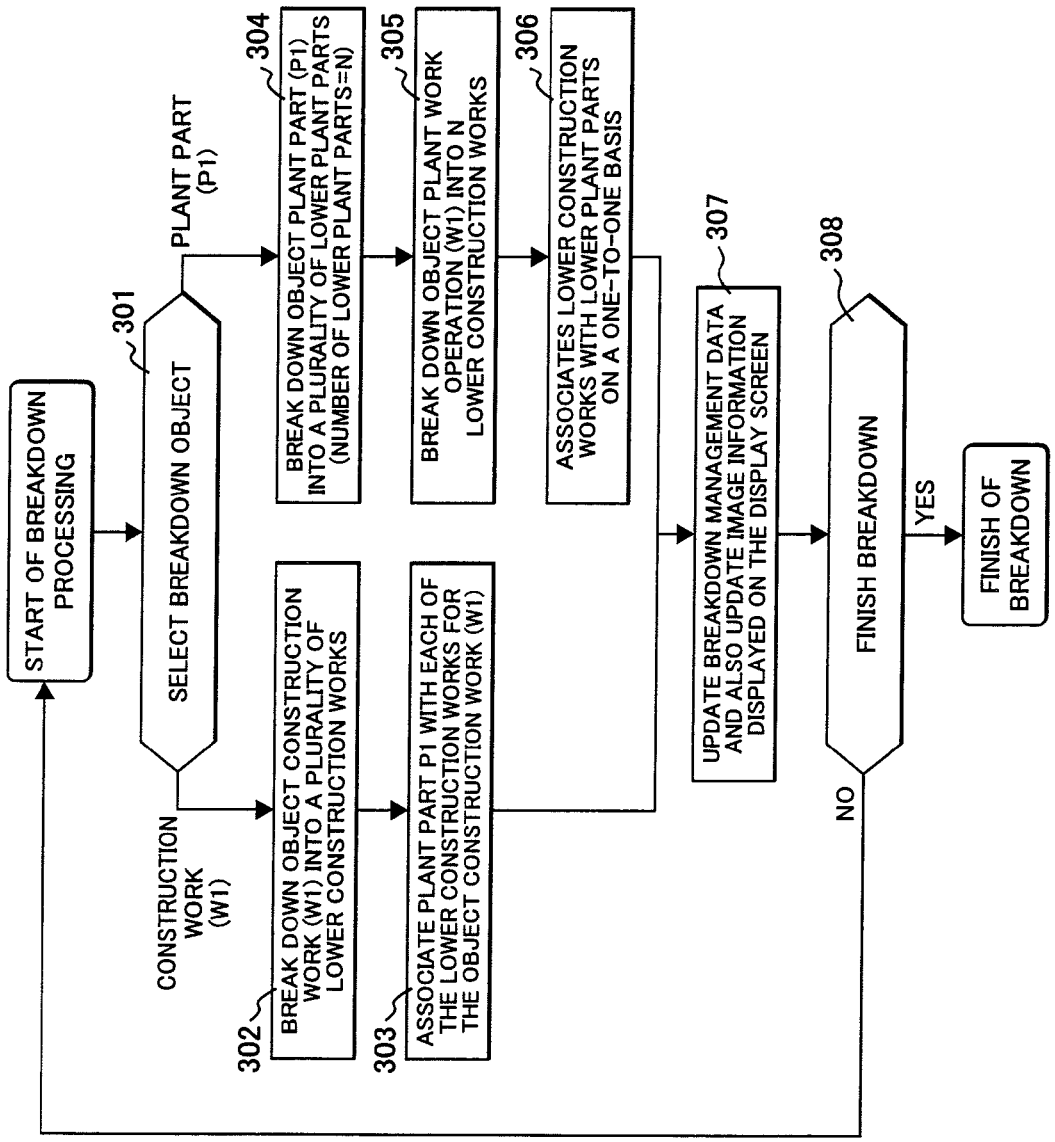
FIG. 3 is a flowchart showing a processing flow executed by the breakdown and association management system shown in FIG. 1.

FIG. 3 shows details of a processing program of the breakdown and association management being used in this embodiment. The processing program in FIG. 3 is prestored in the auxiliary storage apparatus 1603, read out by the central processing apparatus 1602 into the work storage apparatus 1601, and interpreted and executed one step at a time by the central processing apparatus 1602. In the system for generating data of plant construction simulation shown in FIG. 1, a breakdown and association management system executes the processing program of the breakdown and association management.

The processing flow will be described using a construction work W1 and plant part P1 associated with it in advance as an example. For example, the construction work W1 is an installation of a pipe (hereinafter referred to as large-bore pipe) having a large-bore, and the plant part P1 is a large-bore pipe, which is a work object of the construction work W1. The construction works include from installation of an entire plant which is an upper construction work to welding of a drain pipe which is a lower construction work. Similarly, the plant part include from an entire plant which is an upper plant part to a drain pipe which is a lower plant part.

In step 301, the construction planner determines whether a construction work or a plant part is to be broken down.

[Breakdown Processing of the Construction Work]

When breakdown object is the construction work W1, the construction planner breaks down the object construction work into a plurality of lower construction works in step 302. At that time, the construction planner inputs the number of lower construction works into which the construction work W1 is broken down and construction work names assigned to the lower construction works from the input apparatus 1605. The system then automatically associates the lower construction works of the object construction work W1 with the plant part P1 in step 303.

Figure 4:
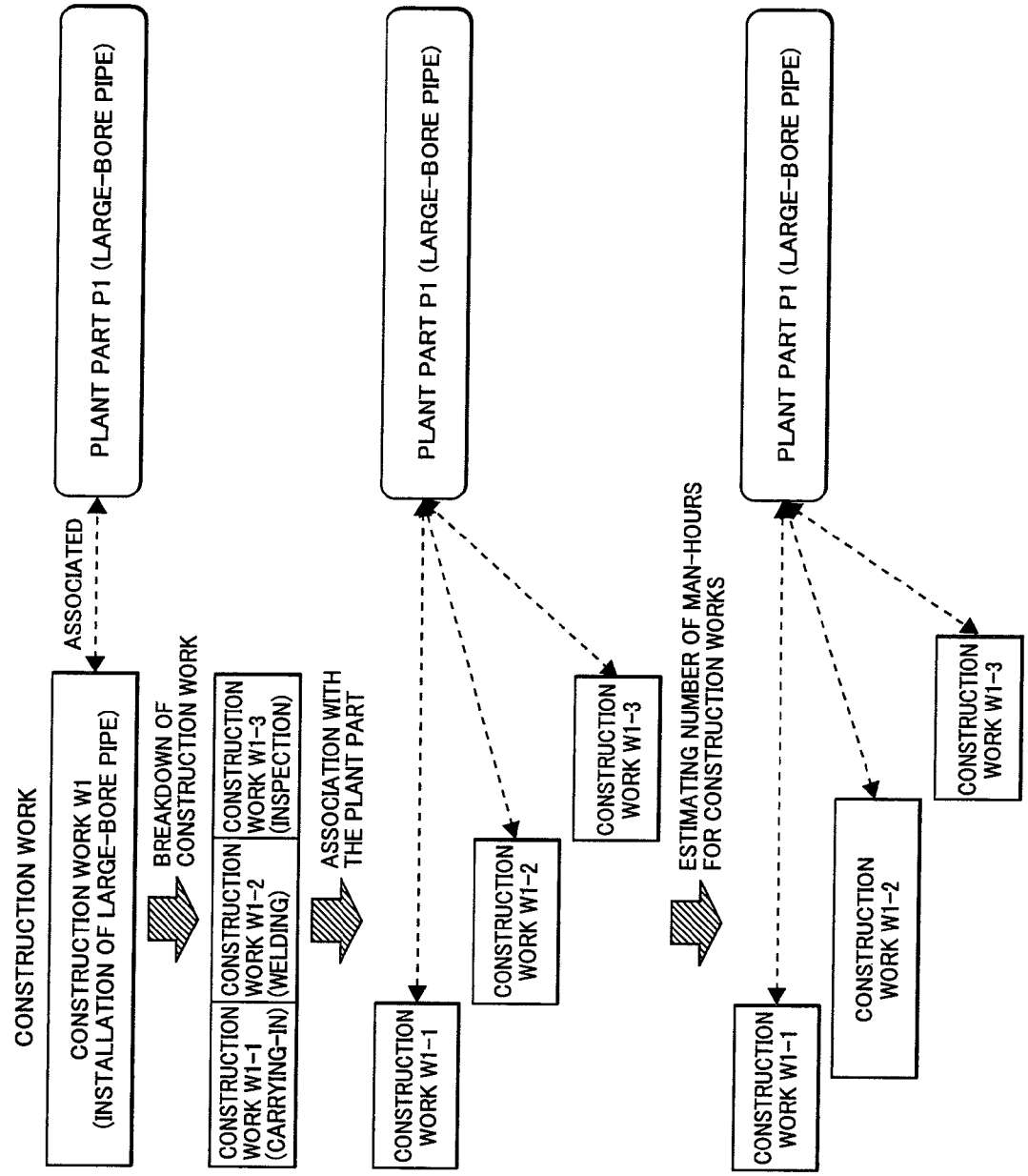
FIG. 4 is an explanatory drawing showing a breakdown of construction work of a plant.

FIG. 4 schematically illustrates the above breakdown of the construction work. Assume that the construction work W1 is an "installation of large-bore pipe" and the plant part P1 associated with it is a "large-bore pipe". The construction planner specifies the construction work W1 and gives an input indicating that installation of the large-bore pipe includes "carrying-in", "welding" and "inspection" (step 302). The system automatically assigns three IDs (W1-1, W1-2 and W1-3) to these three lower construction works. Since each of the plant parts associated with these lower construction works is a large-bore pipe named P1, the system automatically gives P1 as part IDs associated with W1-1, W1-2 and W1-3.

To indicate that the construction work named "installation of large-bore pipe" comprises three lower construction works, that is, "carrying-in", "welding" and "inspection", it may be prestored in breakdown management data as work breakdown definition data in the step 302. In this case, when construction work "installation of large-bore pipe" is selected, the system according to this embodiment references the breakdown management data and automatically makes a setting indicating that the construction work comprises three lower construction works named "carrying-in", "welding" and "inspection". Therefore, the construction planner does not need to manually input the names of the lower construction works.

The work data and part data stored in the auxiliary storage apparatus 1603, and how the work data and part data are updated when a construction work is broken down will be described below with reference to FIGS. 5A, 5B, 6A, and 6B. FIG. 5A represents the structure of work data for the construction work W1. The work data assumed in this embodiment includes at least a construction work ID, a work name, an upper construction work ID, an associated part ID, and other work attributes. The other work attributes are work attribute data as a day to start the work, a day to finish the work and the number of man-hours for the work and the like, which is generally used in a process planning system. Details of the other work attributes depend on the system, so there is no particular limitation in this embodiment. FIG. 5A indicates that the name of the construction work W1 is "installation of large-bore pipe" and the associated plant part ID is P1. In this embodiment, the upper construction work of the construction work W1 is not used in the description below, so it is represented by a hyphen (-) to indicate an omission. FIG. 5B indicates the part data of the plant part P1. The part data assumed in this embodiment includes at least a plant part ID, a part name, an upper plant part ID, an associated work ID and other part attributes. The other part attributes are part attribute data as the shape and installation position of the part and the like, which is generally used in a 3D-CAD system. Details of the other part attributes depend on the system, so there is no particular limitation in this embodiment. FIG. 5B indicates that the name of the plant part P1 is "large-bore pipe" and the associated construction work ID is W1. In this embodiment, the upper plant part of the plant part P1 is not used in the description below, so it is represented by a hyphen (-) to indicate an omission.

As a result of the breakdown of the construction work in the previous step 302, as shown in FIG. 6A, new associated records are added for W1-1, W1-2, and W1-3, which are lower construction works of the construction work W1 in the work data. Their work names (carrying-in of large-bore pipe, welding of large-bore pipe, and inspection of large-bore pipe), upper construction work IDs (W1 for all the lower construction works), associated part IDs (P1 for all the lower construction works), and other attributes are automatically set and stored in the auxiliary storage apparatus 1603.

Due to the above processing, when the construction planner specifies a desired construction work to break it down, the breakdown and association management system automatically associates plant parts with lower construction works. All that is required for the construction planner is to enter the number of lower construction works and their names.

[Breakdown Processing of Plant Part]

When in FIG. 3, breakdown object is the plant part P1, the construction planner breaks down the object plant part P1 into a plurality of lower parts (N lower parts) in step 304. At that time, the construction planner inputs the number of lower plant parts into which the upper plant part P1 is broken down and part names assigned to the lower parts from the input apparatus 1605. The system then automatically associates the object construction work W1 with N lower construction works in step 305, and also automatically associates the N lower construction works with N lower plant parts on a one-to-one basis in step 306.

Figure 7:
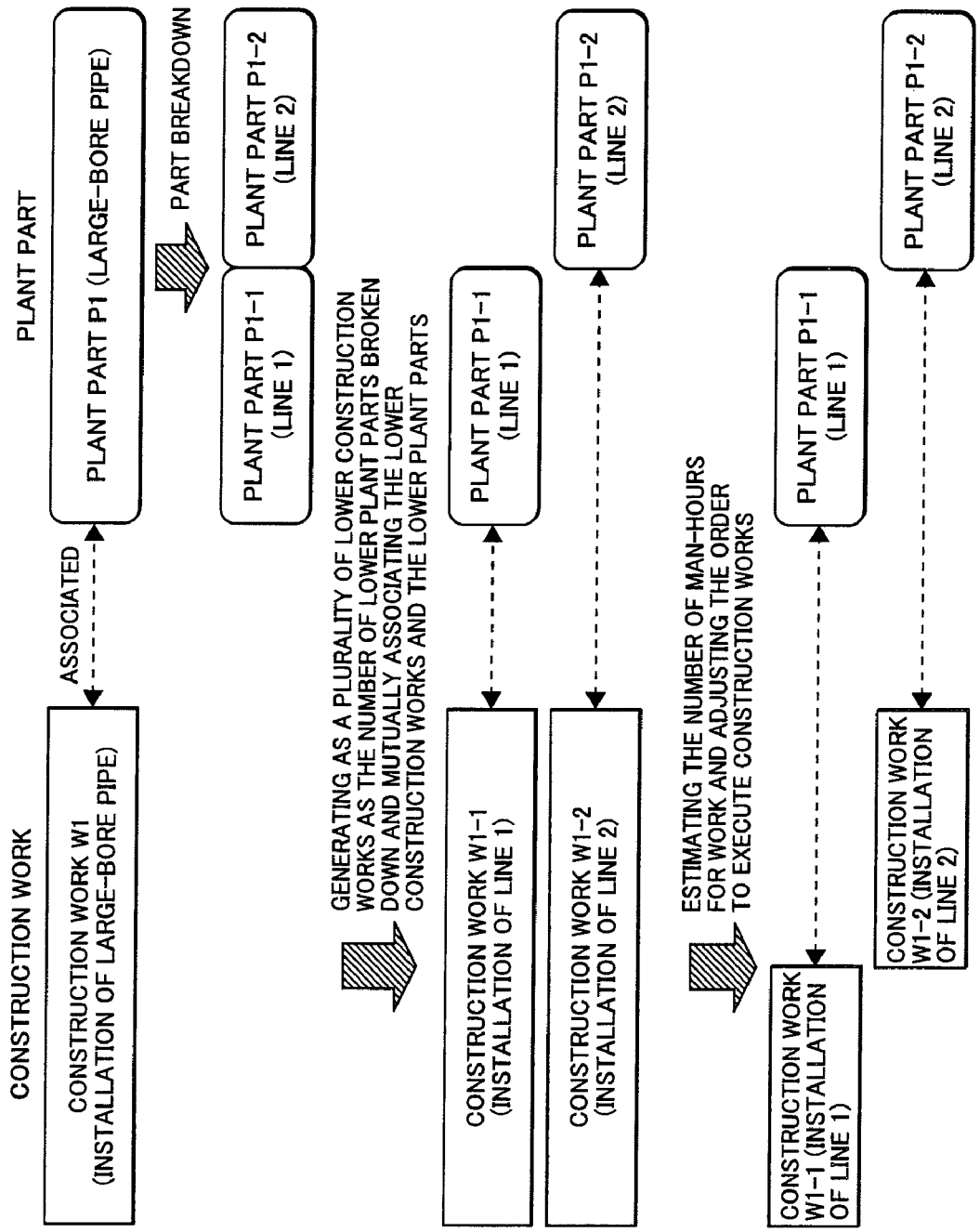
FIG. 7 is an explanatory drawing showing a breakdown of plant part.

FIG. 7 schematically illustrates a process of the above breakdown of the plant part. In this drawing as well, assume that the upper construction work W1 is "installation of large-bore pipe" and the upper plant part P1 associated with it is "large-bore pipe". The construction planner specifies the plant part P1 and gives an input indicating that the large-bore pipe is comprised of two lower plant parts named line 1 and line 2 (step 304). The system automatically assigns P1-1 and P1-2 which are IDs, to the two lower plant parts and generates construction works W1-1 and W1-2 corresponding to these lower plant parts as lower construction works of the upper construction work W1 (step 305). The lower construction work W1-1 is equivalent to "installation of large-bore pipe line 1" and the lower construction work W1-2 is equivalent to "installation of large-bore pipe line 2". Since the lower construction works W1-1 and W1-2 respectively correspond to lower plant parts P1-1 and P1-2, the system automatically gives P1-1 and P1-2 as part IDs associated with the lower construction works W1-1 and W1-2, respectively (step 306).

How data is updated during the breakdown of the plant part will be described with reference to FIGS. 5A, 5B, 8A, 8B, 9A, and 9B. As described above, FIG. 5A represents work data for the construction work W1, and FIG. 5B indicates initial part data for the plant part P1 associated with the construction work W1.

As a result of the breakdown of the plant part in the previous the step 305, as shown in FIG. 8B, new associated records are added for P1-1 and P1-2, which are lower plant parts of the plant part P1, in the part data. Their part names (large-bore pipe line 1 and large-bore pipe line 2), upper plant part IDs (P1 for all the lower plant parts) and other attributes are automatically set.

As a result of the processing in the step 306, as shown in FIG. 9A, new associated records are added for W1-1 and W1-2, which are the lower construction works of the upper construction part W1 that respectively correspond to the lower plant parts P1-1 and P1-2. Their work names (installation of large-bore pipe line 1 and installation of large-bore pipe line 2), upper construction work IDs (W1 for both lower construction works) and other attributes are automatically set. Furthermore, associated part IDs and associated work IDs are automatically set in the work data and part data, respectively, so that the lower construction works W1-1 and W1-2 are respectively associated with the lower plant parts P1-1 and P1-2. That is, the system sets P1-1 as the associated part ID of the lower construction work W1-1, P1-2 as the associated part ID of the lower construction work W1-2, W1-1 as the associated construction work ID of the lower plant part P1-1 and W1-2 as the associated construction work ID of the lower plant part P1-2 and stores these IDs in the auxiliary storage apparatus 1603.

[Update Processing]

Due to the above processing, the work data or part data is updated and the updated data is stored in the auxiliary storage apparatus 1603. In step 307, the progress and result of the breakdown of the construction work or the breakdown of the plant part are added to the breakdown management data, together with association between the progress and result. The image information being displayed on the display (the output apparatus 1604) of the system for generating data of plant construction simulation according to this embodiment is updated based on the updated work data, the updated part data and the updated breakdown management data.

[Finish of the Breakdown Processing]

In step 308 in FIG. 3, the construction planner is asked whether to continue the breakdown for another construction work or plant part, and the processing is continued or finished accordingly.

[Example of an Operation Screen]

An example of an operation screen on which the processing in FIG. 3 is implemented will be described.

Figure 10:
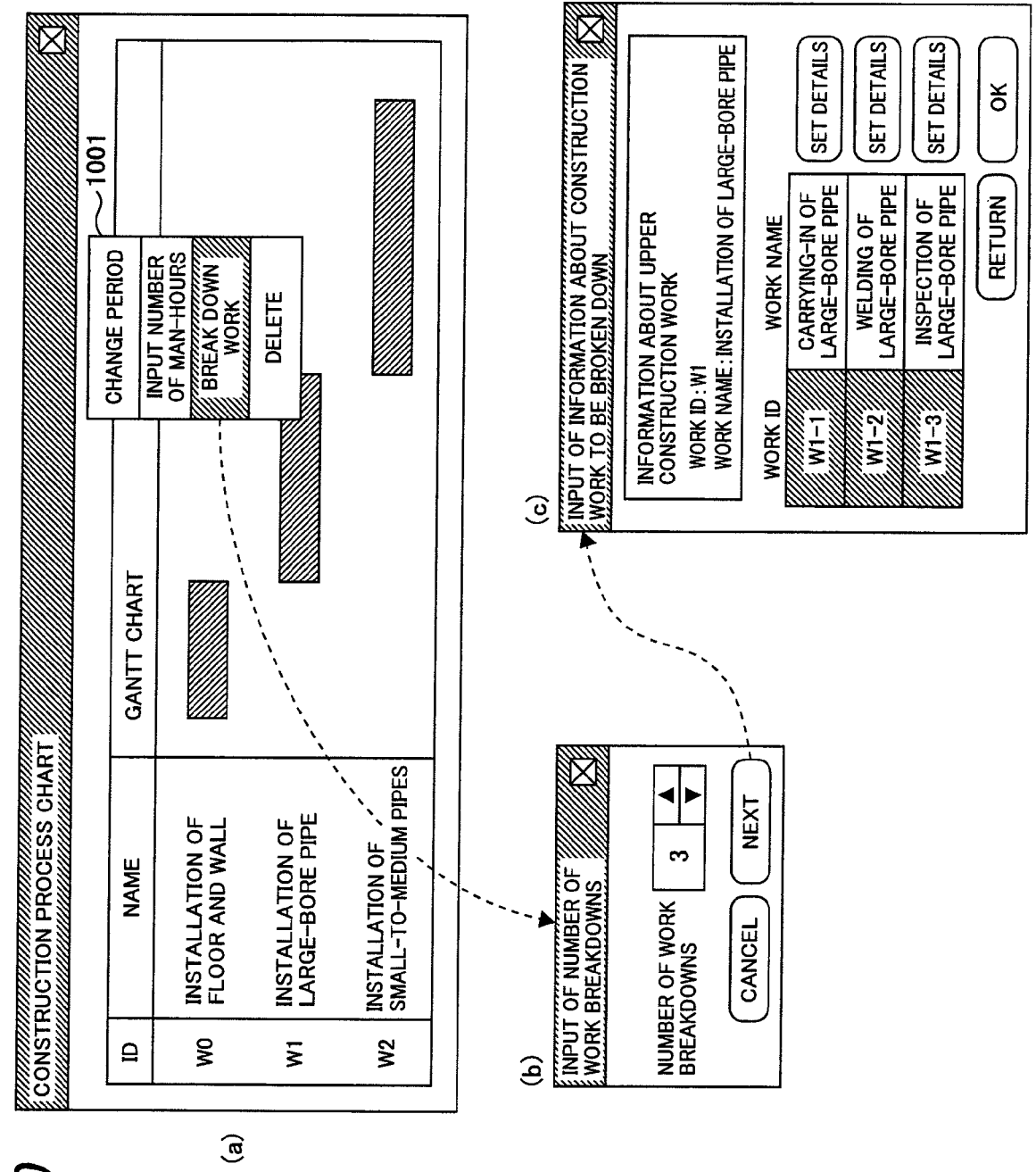
FIG. 10 is an explanatory drawing showing examples of operation screens on which to carry out the breakdown of the construction work.

A (a) in FIG. 10 shows an example of a construction process chart displayed on the output apparatus 1604 of the computer in the system according to this embodiment. This chart is part of a construction process planning chart in the Gantt chart format, which is generally used by MS-Project, Primavera, and other commercially available scheduling software. The chart indicates that there are three construction works denoted W0 (installation of floor and wall), W1 (installation of large-bore pipe), and W2 (installation of small-to-medium pipes). In general, users of scheduling software use these types of charts to add or delete construction works and change an execution time.

[Example of an Operation Screen during the Breakdown of the Construction Work]

Figure 11:
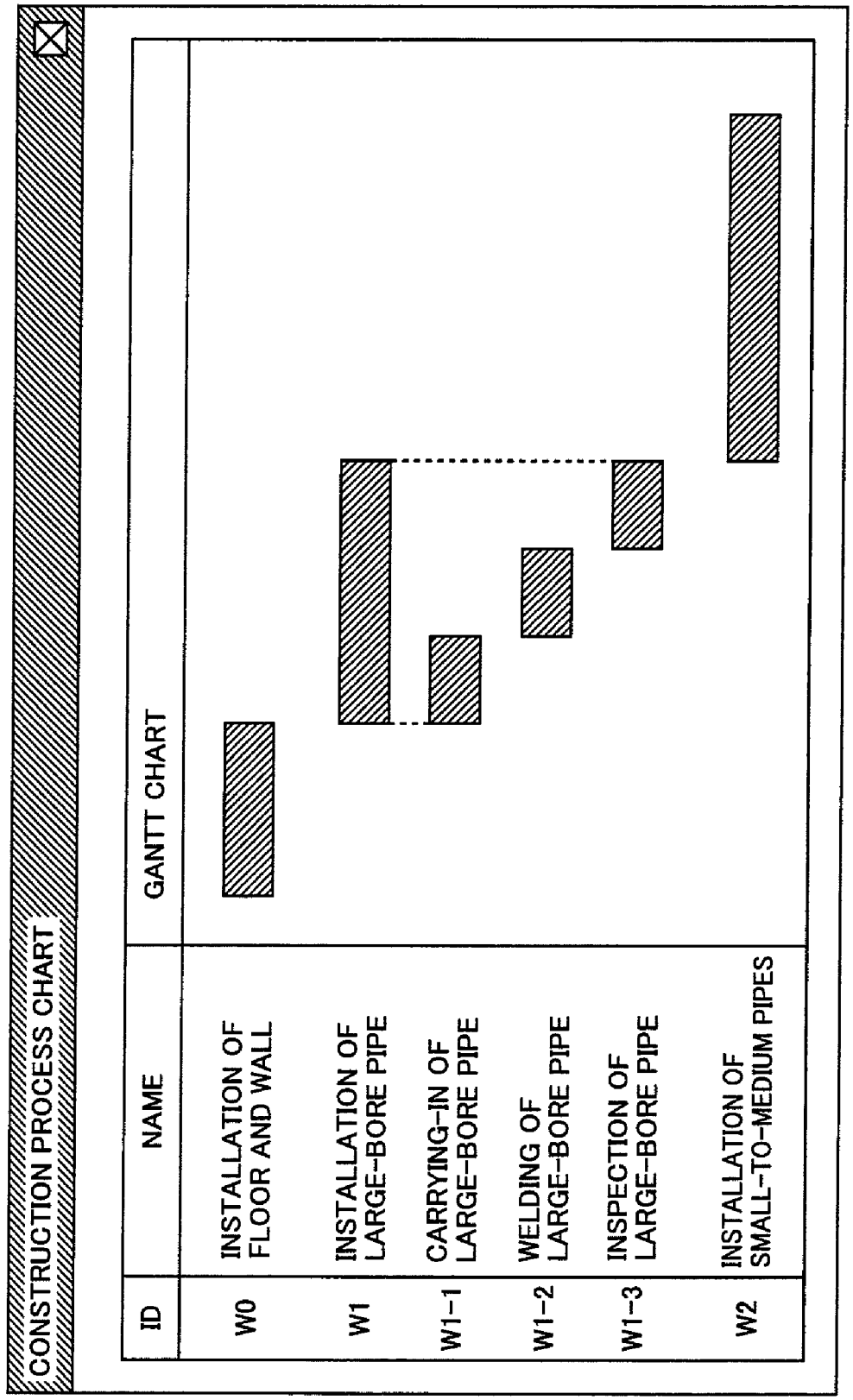
FIG. 11 is an explanatory drawing showing a construction process chart obtained as a result of the breakdown of the construction work.

In this embodiment, an example of an operation screen used during the breakdown the breakdown of the construction work will be described first. The construction planner uses the process planning system to select, by using the input apparatus 1605 (an ordinary two-button mouse and a keyboard in this embodiment), a desired construction work (W1, that is, installation of large-bore pipe, in this embodiment) to be broken down on the construction process chart displayed on the output apparatus 1604 (an ordinary CRT in this embodiment), and right-clicks the mouse. A menu dialog box 1001 is then displayed. The construction planner selects "Breakdown of work" from it, displaying a dialog box, shown in a (b) in FIG. 10, on the output apparatus 1604. The construction planner selects the number of lower construction works into which the construction work is broken down, from the dialog box. In this embodiment, the construction planner inputs 3 from the input apparatus 1605 as the number of breakdowns, indicating that the construction planner intends to break down "installation of large-bore pipe" into three low-order construction works, that is, "carrying-in of large-bore pipe", "welding of large-bore pipe", and "inspection of large-bore pipe". When the construction planner clicks on the "Next" button in the dialog box, another dialog box, shown in a (c) in FIG. 10, into which work names of the lower construction works and other information are inputted, is displayed. Although the construction planner can set the lower construction work IDs (W1-1, W1-2 and W1-3) displayed in the dialog box by himself or herself, the system preferably assigns unique IDs to the project. In this embodiment, however, the construction planner sets the work names (carrying-in of large-bore pipe, welding of large-bore pipe, and inspection of large-bore pipe) from the input apparatus 1605 at his or her discretion. It is also preferable that the system guides the construction planner so that consistent work names such as names indicating a hierarchical structure of the construction work are set, and has a function for checking for duplication of the set part names. Each "Set details" button in the (c) in FIG. 10 is provided to call processing for setting and modifying detailed attribute information (including the number of man-hours, a date to start the work, a date to finish the work, a work period, person taking charge of the work, and necessary resources) about the work corresponding to the button. However, details of the processing are not limited in this embodiment. The button operations described above are equivalent to the button operation in the step 302 in FIG. 3. When the construction planner clicks the "OK" button shown in the (c) in FIG. 10, the processing in the step 303 is executed. The work data and part data shown in FIGS. 6A and 6B are then generated, and the construction process chart shown in the (a) in FIG. 10 is updated according to the update of the work data. The construction process chart shown in FIG. 11 is then displayed on the output apparatus 1604. In this process chart, it is indicated that the lower construction works W1-1, W1-2 and W1-3 have been generated as lower construction works of the upper construction work W1.

[Example of an Operation Screen during the Breakdown of the Plant Part]

Figure 12:
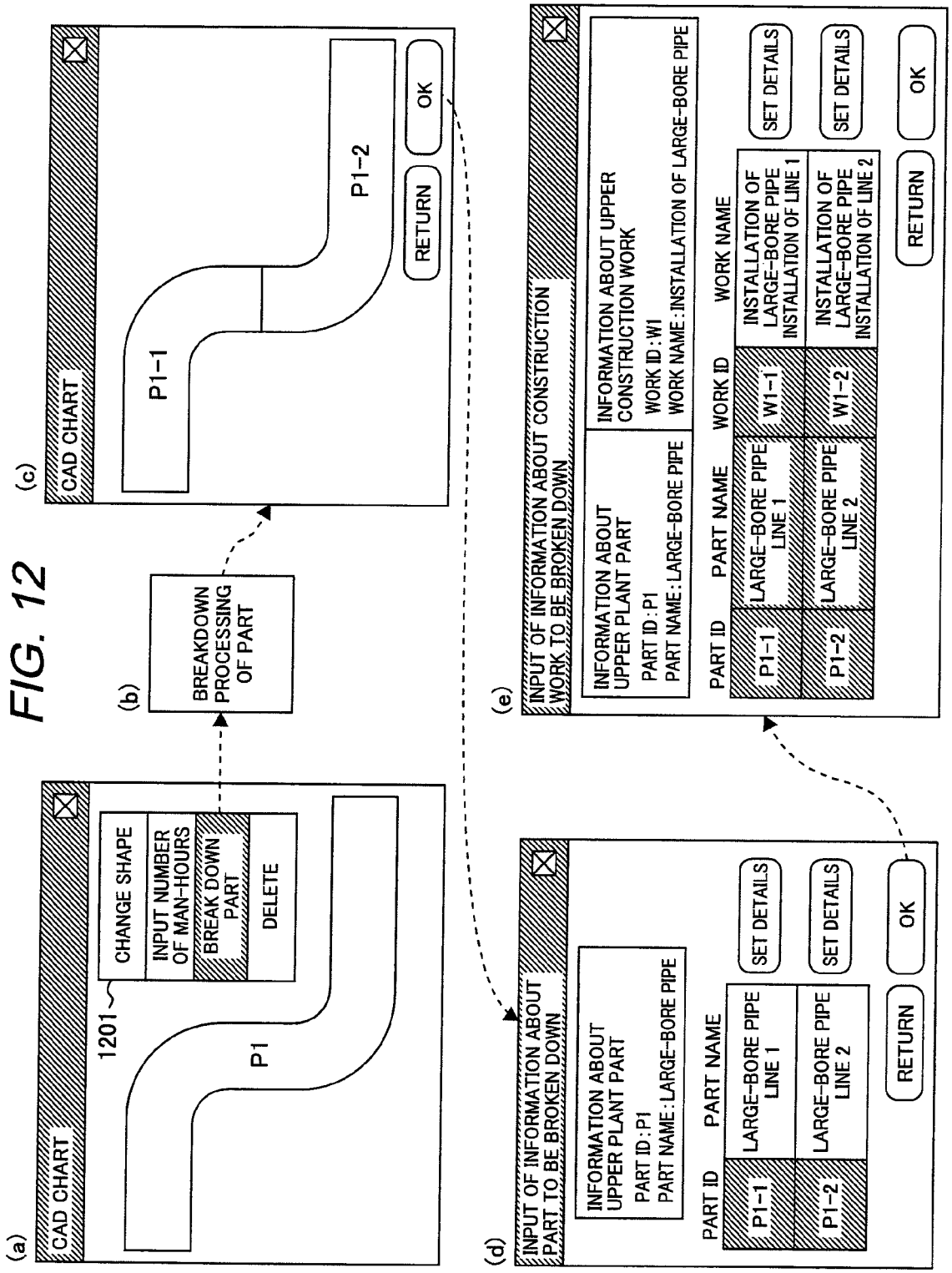
FIG. 12 is an explanatory drawing showing examples of operation screens on which to carry out the breakdown of the plant part.

Next, an example of an operation screen during the breakdown of the plant part will be described. The construction planner uses the 3D-CAD system to select, on the CAD screen of the output apparatus 1604, a desired plant part (P1, that is, a large-bore pipe, in this embodiment) to be broken down by using the input apparatus 1605, and right-clicks the mouse. In the description below, a plane view of the pipe will be used to simplify the description, but, in practice, the pipe is represented by a three-dimensional stereograph. A menu dialog box 1201 (see a (a) in FIG. 12) is then displayed on the output apparatus 1604. The construction planner selects "break down part" from the dialog box displayed on the display screen of the input apparatus 1605. Processing (see a (b) in FIG. 12) for breaking down (dividing) a plant part by using the 3D-CAD system is then executed. The operation procedure depends on the operation system of the 3D-CAD system, so there is no limitation on the operation procedure in this embodiment. In this embodiment, it is assumed that as a result of the part breakdown processing, the plant part P1 (large-bore pipe) has been broken down into two lower plant parts (line 1 and line 2) denoted P1-1 and P1-2, as shown in a (c) in FIG. 12. When the construction planner clicks the OK button shown in the (c) in FIG. 12 upon completion of the part breakdown, a dialog box, shown in a (d) in FIG. 12, into which to input the information of part names of the lower plant parts and the like is displayed on the output apparatus 1604. Although the construction planner can set the part IDs (P1-1 and P1-2) displayed in the dialog box by himself or herself, the system preferably assigns unique IDs to the project. In this embodiment, however, the construction planner sets the part names (large-bore pipe line 1 and large-bore pipe line 2) from the input apparatus 1605 at his or her discretion. It is also preferable that the system guides the construction planner so that consistent part names such as names indicating a hierarchical structure of the plant part are set, and has a function for checking for duplication of the set part names. Each "Set details" button in the (d) in FIG. 12 is provided to call processing for setting and modifying detailed attribute information (including a geometry, an installation position, a weight, a material and functions of the part) about the part corresponding to the button. However, details of the processing are not limited in the embodiment.

Figure 13:
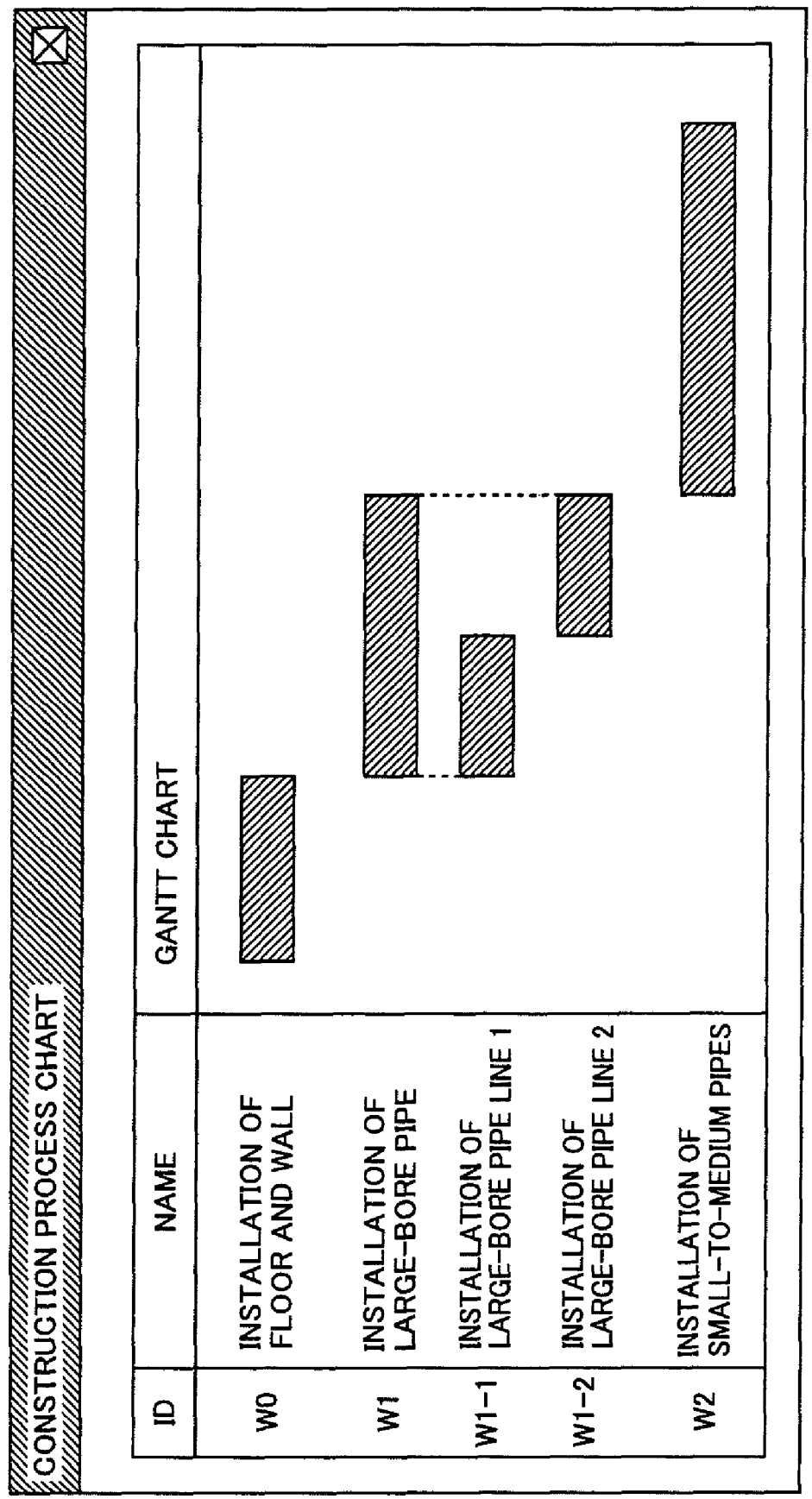
FIG. 13 is an explanatory drawing showing a construction process chart obtained as a result of the breakdown of the plant part.

The button operations described above are equivalent to button operations in the step 304 in FIG. 3. When the construction planner clicks the OK button in the (d) in FIG. 12, the processing in the step 305 is executed. Part data of the lower plant parts P1-1 and P1-2 of the upper plant part P1 is generated as shown in FIG. 8B, and work data of the lower construction works W1-1 and W1-2 of the upper construction work W1 is also generated as shown in FIG. 9A. Processing in the step 306 is executed in succession to associate part P1-1 with the lower construction work W1-1 and part P1-2 with the lower construction work W1-2. Since the lower construction works W1-1 and W1-2 are still not assigned work names, a dialog box, shown in a (e) in FIG. 12, into which work names of the lower construction works and other information is inputted, is displayed on the output apparatus 1604. Although the construction planner can set the work IDs (W1-1 and W1-2) displayed in the dialog box by himself or herself, the system preferably automatically assigns unique IDs to the project. In this embodiment, however, the construction planner sets the work names (installation of large-bore pipe line 1 and installation of large-bore pipe line 2) from the input apparatus 1605 at his or her discretion. When the construction planner clicks the OK button in the (e) in FIG. 12, the work data and part data respectively shown in FIGS. 9A and 9B are generated and stored in the auxiliary storage apparatus 1603. In the process planning system, the construction process chart shown in the (a) in FIG. 10 is updated based on the update of the work data, and the construction process chart shown in FIG. 13 is displayed on the output apparatus 1604. The process chart indicates that construction works W1-1 and W1-2 have been generated as the lower construction works of the upper construction work W1.

[Successive Execution of the Breakdown of the Plant Part and the Breakdown of the Construction Work]

Figure 14:
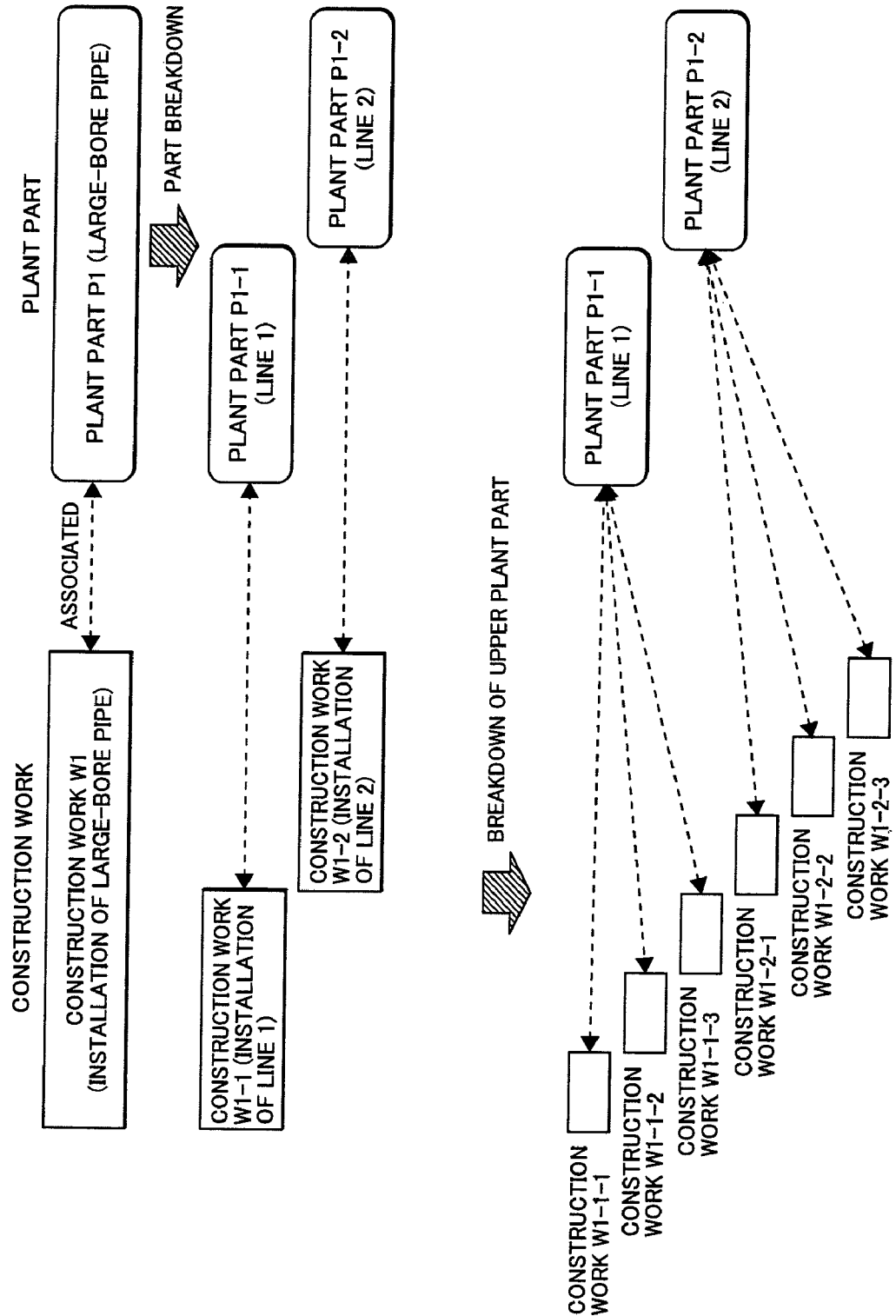
FIG. 14 is an explanatory drawing showing a combination of the breakdown of the construction work and the breakdown of the plant part.

FIG. 14 is a schematic block diagram illustrating a process in which the part breakdown of the plant part P1 and work breakdown of the construction work W1 are executed in succession. When the upper plant part P1 is first broken down into the lower plant parts P1-1 and P1-2, the lower construction works W1-1 and W1-2 are generated, the lower plant part P1-1 being associated with the lower construction work W1-1 and the lower plant part P1-2 being associated with the lower construction work W1-2. Processing up to this point is the same as the part breakdown in FIG. 7. Now, consider a case in which the construction planner further carries out the breakdown of the construction work. The construction planner can also breakdown the lower construction works W1-1 and W1-2 individually. A process for this type of work breakdown is equivalent to the ordinary work breakdown process shown in FIG. 4.

Although the construction work W1 and its lower construction works W1-1 and W1-2 have a parent-child relationship, it is based on the work breakdown that has been executed during the part breakdown of the plant part P1. Accordingly, W1, W1-1, and W1-2 are construction works of the same type (installation of a large-bore pipe, in this embodiment), and their hierarchical levels are the same. When the construction planner specifies the construction work W1 and breaks it down, W1-1 and W1-2, which are the lower construction works of the upper construction work W1, can also be broken down concurrently.

Specifically, when the construction planner specifies the "installation of large-bore pipe" which is the construction work W, from the input unit 1605 and instructs its breakdown into "carrying-in of large-bore pipe", "welding of large-bore pipe", and "inspection of large-bore pipe", the system automatically breaks down the "installation of large-bore pipe line 1" which is the lower construction work W1-1, into three further lower construction works which are "carrying-in of large-bore pipe line 1" of a further lower construction work W1-1-1, "welding of large-bore pipe line 1" a further lower construction work of W1-1-2, and "inspection of large-bore pipe line 1" of a further lower construction work W1-1-3 and then associates each of further lower construction works with the lower plant part P1-1, which is the part associated with the lower construction work W1-1. Similarly, the system automatically breaks down the "installation of large-bore pipe line 2" which is the lower construction W1-2, into three further lower construction works which are "carrying-in of large-bore pipe line 2" of a further lower construction work W1-2-1, "welding of large-bore pipe line 2" of a further lower construction work W1-2-2, and "inspection of large-bore pipe line 2" of a further lower construction work W1-2-3 and then associates each of the further lower construction works with the lower plant part P1-2, which is the part associated with the lower construction work W1-2. FIG. 17 shows the resulting work data.

FIG. 15 shows the breakdown management data generated by the above processing. The breakdown management data is stored in the auxiliary storage apparatus 1603 and is used to manage the process of the work breakdown or part breakdown and its results. As shown in FIG. 15, the breakdown management data includes information of a progress that indicates how the part breakdown and work breakdown have been carried out and also has the IDs and names of the works and parts newly added as a result of the breakdown in association with the IDs of the upper construction works and upper plant parts. Addition of the breakdown management data is carried out in the step 307.

[Estimating the Amount of Construction Work and Adjusting the Order to Execute Construction Works]

After the work breakdown in FIG. 4 or part breakdown in FIG. 7, a plurality of lower construction works of the upper construction work W1 are generated, each of which is associated with a plant part used in the lower construction work. Accordingly, it is possible to estimate the number of man-hours (or a work period, a necessary amount of resources, etc.) based on the type of the construction work and the amount of materials of the part. For example, the lower construction work W1-1 (carrying-in of large-bore pipe) is associated with the plant part P1 (large-bore pipe) in FIG. 4. If a model that estimates the number of man-hours for the construction work based on the amount of materials (such as a total weight, a total length and a total number of parts) of the large-bore pipe is defined, this model can be used to calculate the amount of materials of the plant part P1, and then the number of man-hours (or a work period, a necessary amount of resources, etc.) of the lower construction work W1-1 can be estimated based on the calculation results. In this embodiment, the model for calculating the number of man-hours is not limited to any particular model; an existing appropriate model may be used according to the type of construction work, the type of object part, and the like. Similarly, other appropriate models for calculating the number of man-hours can also be used for the construction works W1-2 and W1-3 to estimate the number of man-hours; the estimation result can be reflected in each data of "number of man-hours", "day to start work", "day to finish work", "number of work days" (not shown) and "work resources" (not shown) and the like. These data were included in "other work attributes" in the work data shown in FIG. 5A. In the breakdown processes in FIGS. 4 and 7, as described above, the work periods of lower construction works as described above are automatically adjusted by finally using the models or calculating the number of man-hours. When this processing is used, a more accurate number of man-hours can be estimated and a construction plan can be made with high accuracy.

An order to execute construction works may be determined during the work breakdown or part breakdown. When, for example, a construction work is broken down, the resulting lower construction works may have a sequence relationship as described in this embodiment in which the lower construction works are "carrying-in", "welding" and "inspection". In this case, processing to change "date to start work" and "date to finish work" in the work data in FIG. 5A to satisfy the sequence relationship can be added to determine an order to execute the construction works. The construction planner may input the sequence relationship from the input apparatus 1605. If, however, sequence data preset in the auxiliary storage apparatus 1603 is read out and used, the burden of the construction planner can be reduced.

In the case of the part breakdown, it may be known that line 1 is installed before line 2 is installed in FIG. 7, for example. An order to execute the construction works can then be determined by changing "date to start work" and "date to finish work" in the work data in FIG. 5A so that the lower construction work W1-1 (installation of line 1) is executed before the lower construction work W1-2 (installation of line 2) is executed. The construction planner may also input this sequence relationship from the input apparatus 1605. If, however, sequence data preset in the auxiliary storage apparatus 1603 is read out and used, as described above, the burden of the construction planner can be reduced.

The processing to estimate the amount of construction work and processing to adjust the operation procedure described above are preferably executed when work data or part data is updated as a result of work breakdown or part breakdown (during execution of the step 303 or 306 in FIG. 3, for example).

[Predefining a Breakdown Method]

In the previous embodiment, to indicate the number of lower construction works into which a construction work is broken down and their types or the number of lower plant parts into which a part is broken down and their types, the construction planner gives an input from the input apparatus 1605 in the steps 302 or 304. If rules for this type of work breakdown and part breakdown are predefined, the burden on the construction planner can be reduced.

Figure 18:
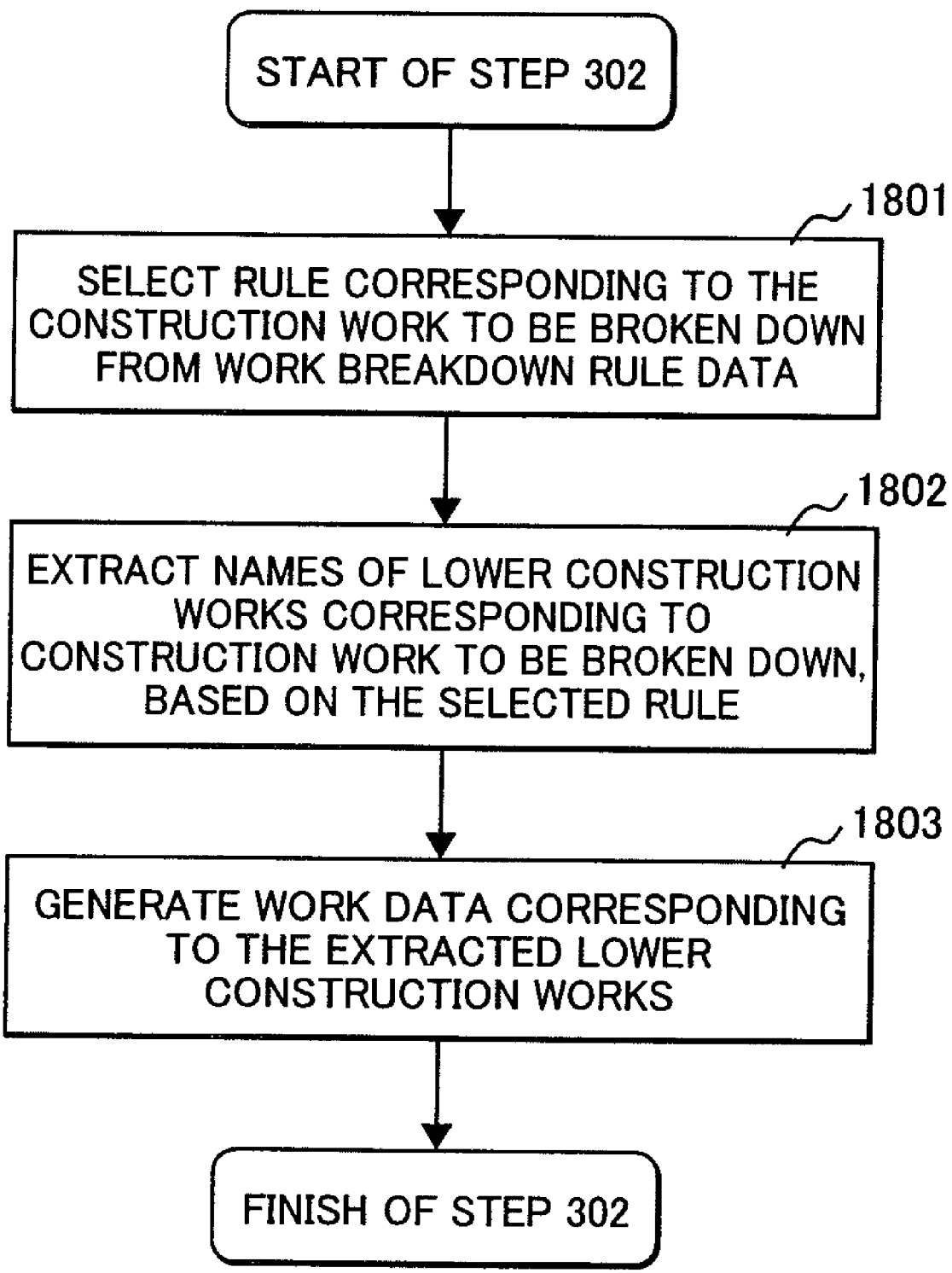
FIG. 18 is a flowchart showing the breakdown of the construction work in which predefined breakdown rules of the construction work are used.

FIG. 18 illustrates processing in the step 302 when predefined work breakdown rules are used to break down a construction work. FIG. 19 shows exemplary work breakdown rules. In FIG. 19, three work breakdown rules are defined. For example, these three work breakdown rules include a first rule which is "installation of large-bore pipe", a second rule which is "carrying-in of large-bore pipe" and a third rule which is "installation of electric equipment". The first rule defines that the construction work "installation of large-bore pipe" is broken down into three lower construction works, which are "carrying-in of large-bore pipe", "welding of large-bore pipe" and "inspection of large-bore pipe". The column "Execution order" in FIG. 19 indicates an order to execute the lower construction works described in the previous embodiment. In step 1801 in FIG. 18, the construction planner selects a rule corresponding to a construction work to be broken down from the work breakdown rule data in FIG. 19. Alternatively, the system automatically selects the rules. For example, suppose that construction work to be broken down is "installation of large-bore pipe" which is the construction work W1 as in the previous embodiment. The first Rule corresponds to this construction work. In step 1802, the names of the lower construction works corresponding to the construction work to be broken down are extracted. The lower construction works in the first rule are "carrying-in of large-bore pipe", "welding of large-bore pipe" and "inspection of large-bore pipe". These three names are extracted as the names of each the lower construction works. In step 1803, the system generates work data corresponding to the extracted lower construction works (equivalent to work data in FIG. 6A).

In general, a construction work for a plant is broken down according to a hierarchy comprising the entire plant planning, building planning, floor planning, construction segmentation planning and on-site planning. A work breakdown structure (WBS) represents the specific structure of the hierarchy. Accordingly, the work breakdown rule data can be automatically generated by logically extracting the hierarchical relationship of the construction work from the WBS. If this processing is introduced, the burden required to generate the work breakdown rule data can be reduced.

It is also possible to use predefined part breakdown rules to carry out the part breakdown in the same way as described above. FIG. 20 shows exemplary part breakdown rules. In FIG. 20, three part breakdown rules are defined. For example, these three part breakdown rules include a first rule which is "large-bore pipe", a second rule which is "line 1" and a third rule which is "electric equipment". The first rule defines that the plant part "large-bore pipe" is broken down into two lower plant parts, which are "line 1" and "line 2". The column "Execution order" in FIG. 20 indicates an order to execute the construction works associated with the lower plant parts as described in the previous embodiment. Details of the step 304 in which the part breakdown is carried out by using the part breakdown rules are the same as for the work breakdown using the work breakdown rules. The step 304 can be understood by reading "work operation" in the processing flow in FIG. 18 as referring to "part". As a result of this processing, the system creates part data, as shown in FIG. 8B, which corresponds to the lower plant parts.

In general, a part for piping is broken down according to a hierarchy comprising a plant, buildings, systems, lines and single pipes. A piping and instrument diagram (P & ID) represents the specific structure of the hierarchy. Accordingly, the part breakdown rule data corresponding to the piping can be automatically generated by logically extracting the hierarchical relationship of the piping from the piping and instrument diagram. If this processing is introduced, the burden required to generate the part breakdown rule data can be reduced.

[Changing Work Data and Part Data]

Figure 2:
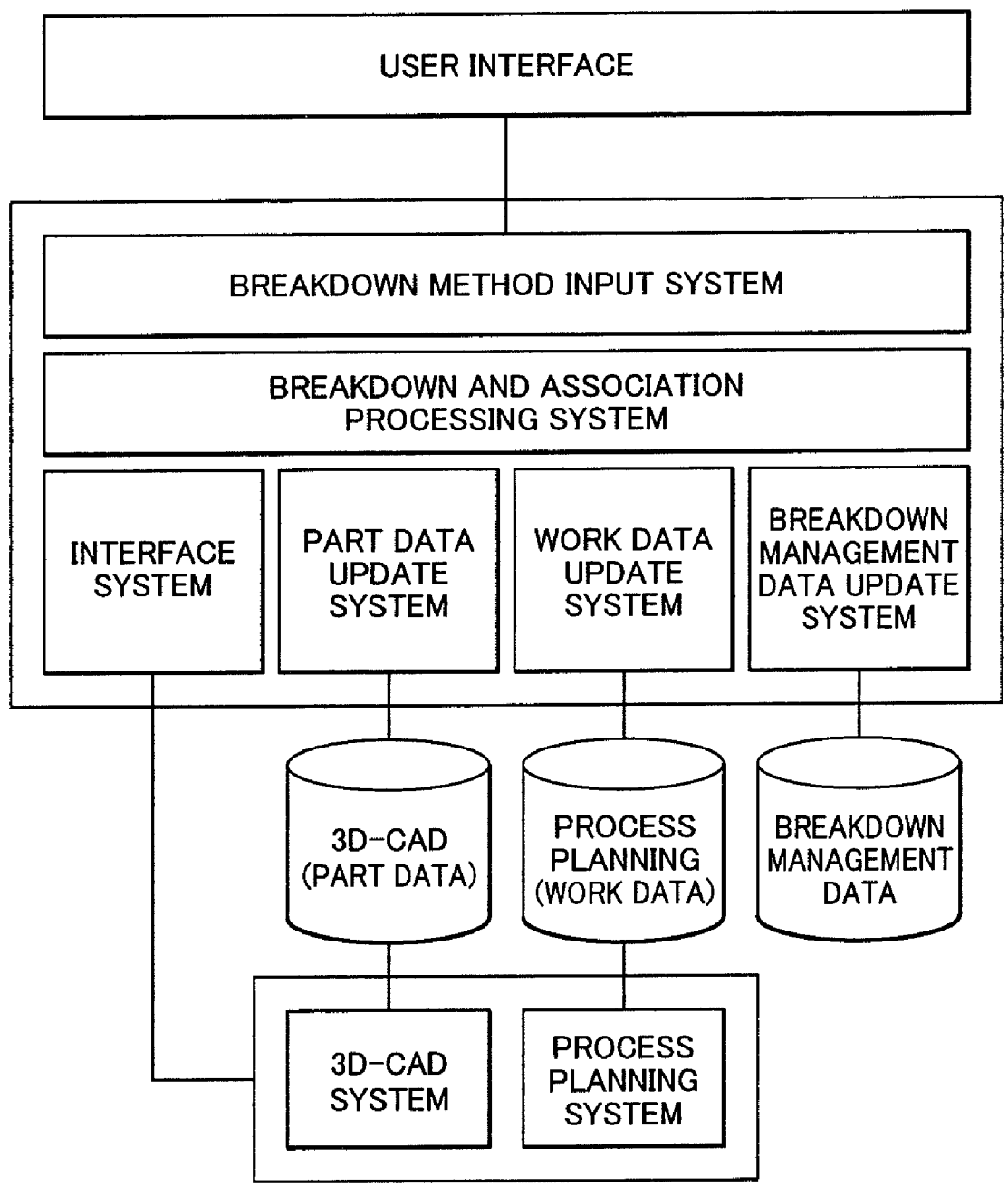
FIG. 2 is a detailed structural diagram showing a breakdown and association management system shown in FIG. 1.

The system for generating data of plant construction simulation according to this embodiment may include editing system that supports the construction planner in order to add, change and delete arbitrary work data and part data in an interactive manner. In this case, the work data update system, part data update system, and breakdown and association processing system shown in FIG. 2 execute processing to maintain data consistency when the work data or part data is changed. When an arbitrary construction work is deleted, for example, the ID of the deleted construction work is deleted from the work IDs corresponding to the parts associated with the deleted construction work. Accordingly, after part data and work data are associated by this embodiment, the association can be changed appropriately according to the state of the planning and construction.

[Switching Gantt Chart Display]

In FIG. 14, the part breakdown of the plant part P1 is executed and then the work breakdown of the construction work W1 is executed. In this case, six further lower work names are generated, which are "carrying-in of large-bore pipe line 1", "welding of large-bore pipe line 1", "inspection of large-bore pipe line 1", "carrying-in of large-bore pipe line 2", "welding of large-bore pipe line 2" and "inspection of large-bore pipe line 2". The construction process chart shown in FIG. 21 is displayed on the output apparatus 1604.

When the part breakdown of the plant part P1 is executed and then the work breakdown of the construction work W1 is executed, the same six further lower work names, which are "carrying-in of large-bore pipe line 1", "welding of large-bore pipe line 1", "inspection of large-bore pipe line 1", "carrying-in of large-bore pipe line 2", "welding of large-bore pipe line 2", and "inspection of large-bore pipe line 2", are obtained. The construction process chart in these breakdowns is shown in FIG. 22.

Figure 21:
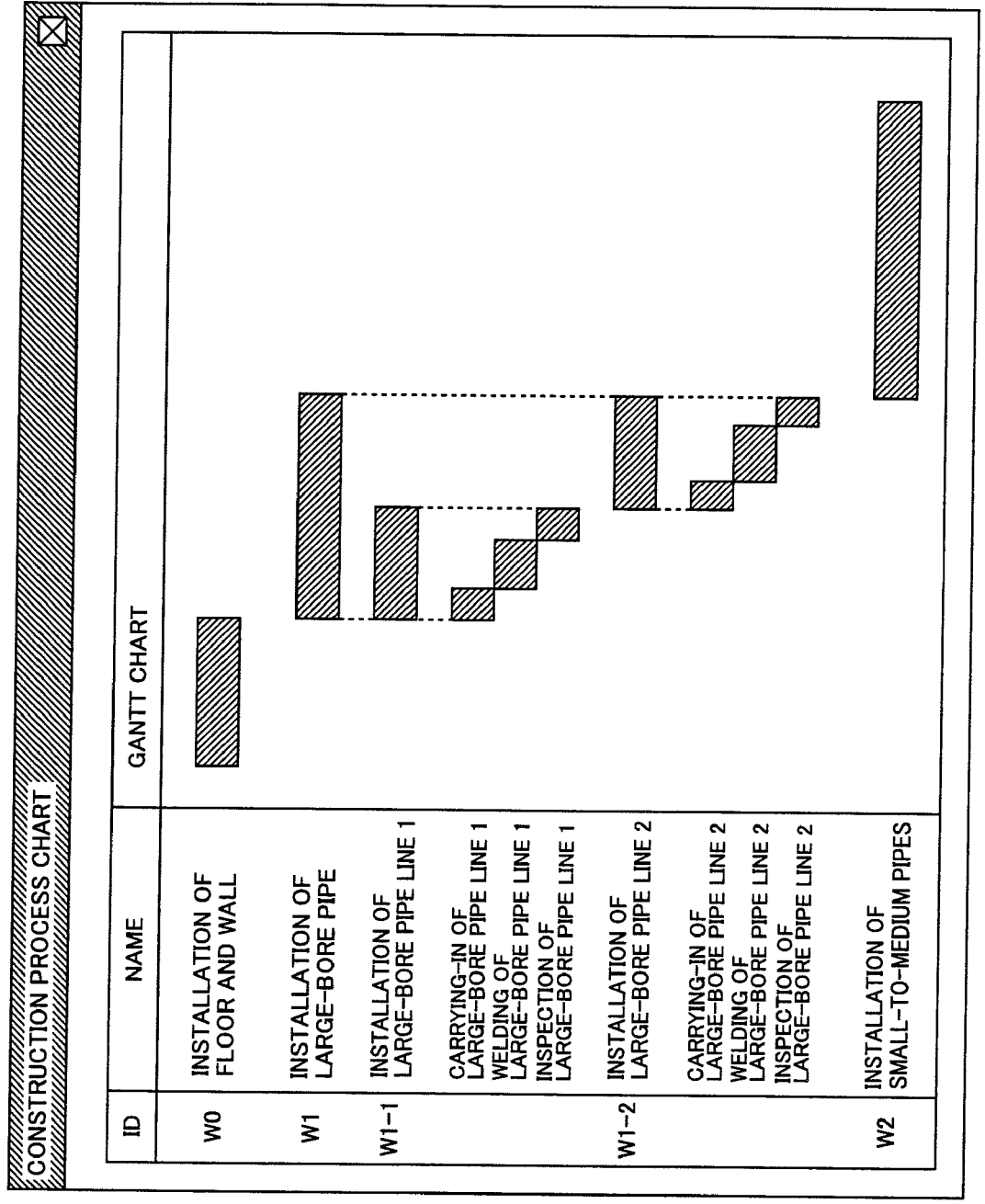
FIG. 21 is an explanatory drawing showing an example of a construction process chart.
Figure 22:
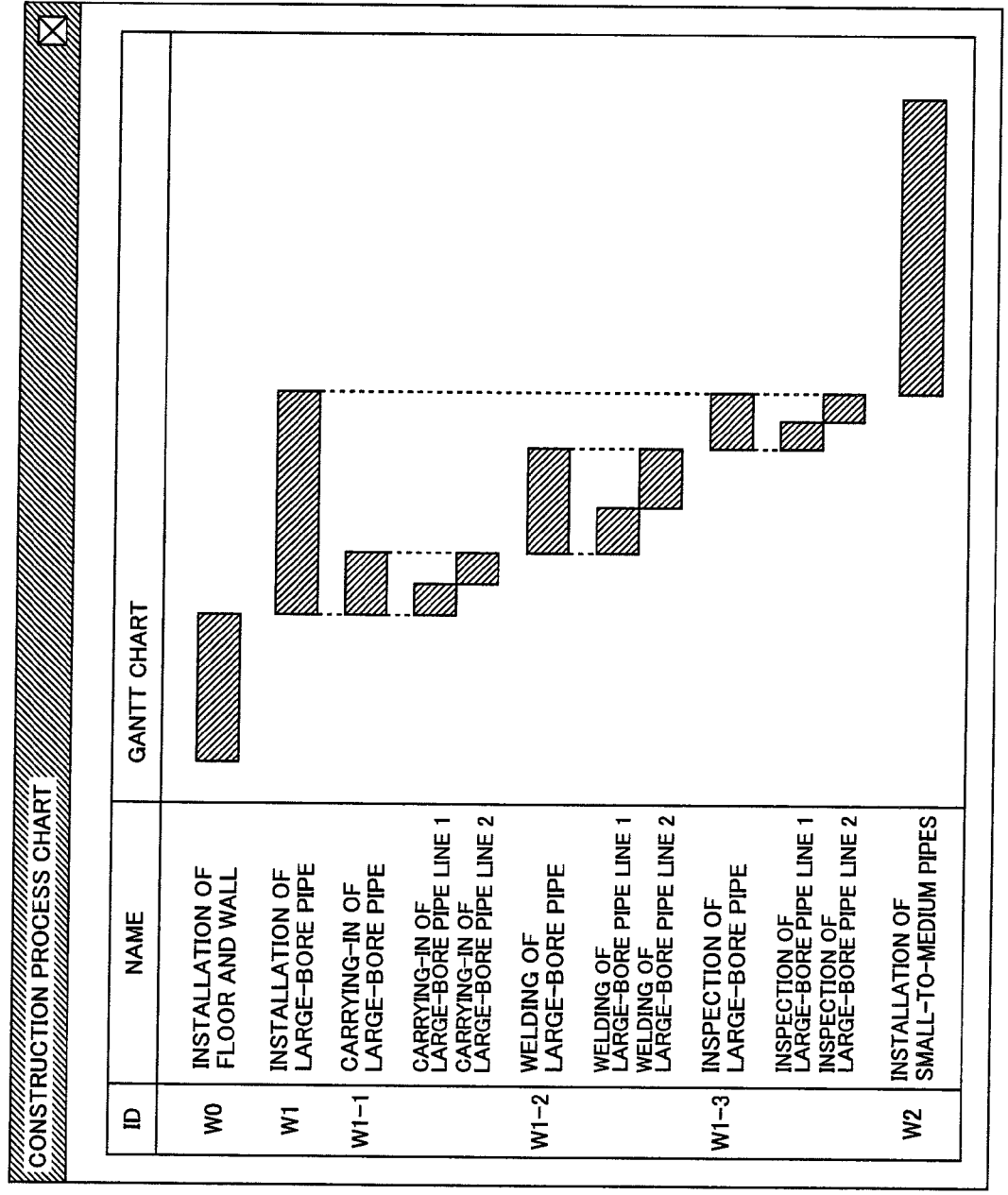
FIG. 22 is an explanatory drawing showing another example of a construction process chart.

The construction process charts in FIGS. 21 and 22 are substantially equivalent to each other at the further lower work level. This nature can also be used by the construction planner to selectively display the construction process chart as shown in FIG. 21 in which the further lower construction works of the construction work W1 are grouped for each lower plant part or as shown in FIG. 22 in which the further lower construction works of the construction work W1 are grouped for each lower construction work. Accordingly, the construction planner can display a construction process chart in which last construction works are grouped in an easy-to-manage format, improving process management efficiency.

INDUSTRIAL APPLICABILITY

The method for generating data of plant construction simulation and a system thereof of the present invention can efficiently generate basic data used to carry out a 4D-CAD simulation, in which a process planning system and a 3D-CAD are linked, for a large-scale construction plan such as for power plant construction and chemical plant construction. When validity of the construction plan is evaluated through the 4D-CAD simulation and necessary changes are added to the process or design, a highly precious, low-risk construction plan can be expected to be generated.

What is claimed is:

1. A method for generating data of plant construction simulation, in which a scheduling system and a CAD system are used to prepare a construction plan, comprising:
   managing a construction work managed by said scheduling system and a plant part used in said construction work and managed by said CAD system, in association with each other;
   specifying the construction work managed by said scheduling system, as specified construction work;
   entering a dividing number by which said specified construction work is to be broken down into; and
   performing processing for associating said plant part with each of a plurality of lower construction work equaling said dividing number and constituting said construction work, which are produced when said specified construction work is broken down based on said dividing number.

2. The method for generating data of plant construction simulation according to claim 1,
   wherein data for associating said construction works and said plant parts to each other based on said processing, is generated as generated data;
   the generated data is used to link said scheduling system and said CAD system to each other; and
   a situation in which appropriate parts are installed as progress of said construction work, is displayed.

3. The method for generating data of plant construction simulation according to claim 1,
   wherein number of man-hours required to execute said generated lower construction works as well as required equipment and materials, are estimated based on types of said generated lower construction works and types and geometries of plant parts associated with these lower construction works.

4. A method for generating data of plant construction simulation, in which a scheduling system and a CAD system are used to prepare a construction plan, comprising:
   managing a construction work managed by said scheduling system and a plant part used in said construction work and managed by said CAD system, in association with each other;
   specifying one plant part managed by said CAD system, as a specified plant part;
   identifying a construction work associated with said specified plant part;
   entering a dividing number by which said specified plant part is to be broken down into; and
   generating, when the plant part is broken down into a plurality of lower plant parts equaling said dividing number on a basis of said dividing number, and constituting said plant part, as a plurality of lower construction works of said construction work as a number of lower plant parts, and performing processing for associating said lower plant parts with said lower construction works.

5. The method for generating data of plant construction simulation according to claim 4,
   wherein data for associating said construction works and said plant parts to each other based on said processing, is generated as generated data;
   the generated data is used to link said scheduling system and said CAD system to each other; and
   a situation in which appropriate parts are installed as progress of said construction work, is displayed.

6. The method for generating data of plant construction simulation according to claim 4,
   wherein number of man-hours required to execute said generated lower construction works as well as required equipment and materials, are estimated based on types of said generated lower construction works and types and geometries of plant parts associated with these lower construction works.

7. A system to generate data of plant construction simulation, in which a scheduling system and a CAD system are used to generate information of a construction plan, comprising:
   a specifying apparatus for specifying one construction work managed by said scheduling system, as specified construction work;
   an input apparatus for entering a dividing number by which said specified construction work is to be broken down into;
   a lower construction work generation apparatus for generating lower construction works equal in number to said entered dividing number;
   a plant part identifying apparatus for identifying a plant part associated with said specified construction work; and
   a plant part associating apparatus for associating said identified plant part with each said generated lower plant part.

8. The system to generate data of plant construction simulation according to claim 7,
   wherein data for associating said construction works and said plant parts to each other based on said processing, is generated as generated data;
   the generated data is used to link said scheduling system and said CAD system to each other; and
   a situation in which appropriate parts are installed as progress of said construction work, is displayed.

9. The system to generate data of plant construction simulation according to claim 7,
   wherein number of man-hours required to execute said generated lower construction works as well as required equipment and materials, are estimated based on types of said generated lower construction works and types and geometries of plant parts associated with these lower construction works.

10. A system to generate data of plant construction simulation, in which a scheduling system and a CAD system are used to generate information of a construction plan, comprising:
    a specifying apparatus for specifying one plant part managed by said CAD system, as a specified plant part;
    a construction work identifying apparatus for identifying a construction work associated with said specified plant part;
    an input apparatus for entering a dividing number by which said specified plant part is to be broken down into;
    a lower construction work generation apparatus for generating lower plant parts of said specified plant part and lower construction works of said construction work equal in number to said entered dividing number; and
    a plant part associating apparatus for associating said lower plant parts with said lower construction works.

11. The system to generate data of plant construction simulation according to claim 10,
    wherein data for associating said construction works and said plant parts to each other based on said processing, is generated as generated data;
    the generated data is used to link said scheduling system and said CAD system to each other; and a situation in which appropriate parts are installed as progress of said construction work, is displayed.

12. The system to generate data of plant construction simulation according to claim 10,
wherein number of man-hours required to execute said generated lower construction works as well as required equipment and materials, are estimated based on types of said generated lower construction works and types and geometries of plant parts associated with these lower construction works.

* * * * *